(12) United States Patent
L'Bassi et al.

(10) Patent No.: US 11,513,542 B2
(45) Date of Patent: Nov. 29, 2022

(54) METHOD AND APPARATUS FOR PULSE GAS DELIVERY USING AN EXTERNAL PRESSURE TRIGGER

(71) Applicant: MKS Instruments, Inc., Andover, MA (US)

(72) Inventors: Michael L'Bassi, Sterling, MA (US); Mark J. Quaratiello, Atkinson, NH (US); Junhua Ding, Boxborough, MA (US)

(73) Assignee: MKS Instruments, Inc., Andover, MA (US)

( * ) Notice: Subject to any disclaimer, the term of this patent is extended or adjusted under 35 U.S.C. 154(b) by 87 days.

(21) Appl. No.: 16/898,016

(22) Filed: Jun. 10, 2020

(65) Prior Publication Data

US 2020/0301455 A1  Sep. 24, 2020

Related U.S. Application Data

(62) Division of application No. 16/124,669, filed on Sep. 7, 2018, now Pat. No. 10,725,484.

(51) Int. Cl.
*G05D 7/06* (2006.01)
*G01F 1/36* (2006.01)
(Continued)

(52) U.S. Cl.
CPC ..... *G05D 7/0635* (2013.01); *C23C 16/45557* (2013.01); *G01F 1/363* (2013.01);
(Continued)

(58) Field of Classification Search
CPC .. G05D 7/0623; G05D 7/0635; G05D 7/0647; G01F 1/363; G01F 15/001; Y10T 137/7761; C23C 16/45557
(Continued)

(56) References Cited

U.S. PATENT DOCUMENTS 4,687,020 A ‡  8/1987  Doyle ................. G05D 7/0635
                                                            137/486
6,062,246 A ‡  5/2000  Tanaka ................ G05D 7/0635
                                                            137/12
(Continued)

FOREIGN PATENT DOCUMENTS

CN   104637768 A  ‡  5/2015
CN   104637768 A       5/2015
(Continued)

OTHER PUBLICATIONS

Notification of Transmittal of the International Search Report and Written Opinion of the International Searching Authority for International Application No. PCT/US2019/047169 entitled "Method and Apparatus for Pulse Gas Delivery Using an External Pressure Trigger," dated Dec. 4, 2019.‡

(Continued)

*Primary Examiner* — William M McCalister
(74) *Attorney, Agent, or Firm* — Hamilton, Brook, Smith & Reynolds, P.C.

(57) ABSTRACT

A fluid control system and associated method for pulse delivery of a fluid includes a shutoff valve and a mass flow controller (MFC) upstream of the shutoff valve. The MFC includes a flow channel, a control valve to control flow of fluid in the flow channel, a flow sensor to measure flow rate in the flow channel, and a controller having a valve input from the shutoff valve indicating opening of the shutoff valve. The controller is configured to respond to the valve input to control flow of fluid through the control valve to initiate and terminate a pulse of fluid from the flow channel to the shutoff valve to control a mass of fluid delivered during the pulse of fluid. The valve input can be a pressure signal, and the MFC can include a pressure sensor to sense the pressure signal.

20 Claims, 12 Drawing Sheets

(51) Int. Cl.
    *G01F 15/00*     (2006.01)
    *C23C 16/455*     (2006.01)

(52) U.S. Cl.
    CPC .......... *G01F 15/001* (2013.01); *G05D 7/0647* (2013.01); *Y10T 137/7761* (2015.04)

(58) Field of Classification Search
    USPC ........................................................ 137/487.5
    See application file for complete search history.

(56) References Cited

U.S. PATENT DOCUMENTS

| | | | |
|---|---|---|---|
| 6,363,958 B1 ‡ | 4/2002 | Ollivier | G05D 7/0647 137/2 |
| 7,628,861 B2 ‡ | 12/2009 | Clark | C23C 16/45544 118/66 |
| 7,971,604 B2 * | 7/2011 | McDonald | G05D 7/0623 222/14 |
| 8,997,686 B2 ‡ | 4/2015 | Ding | C23C 16/448 118/69 |
| 9,151,731 B2 ‡ | 10/2015 | Heitz | G01N 33/4925 |
| 9,236,230 B2 ‡ | 1/2016 | Kato | H01J 37/3244 |
| 9,348,339 B2 ‡ | 5/2016 | Ding | C23C 16/45557 |
| 9,557,744 B2 | 1/2017 | Ding | |
| 9,846,074 B2 | 12/2017 | Ding | |
| 10,031,005 B2 ‡ | 7/2018 | Ding | G01F 1/363 |
| 10,031,531 B2 * | 7/2018 | Ding | G05D 11/132 |
| 10,126,760 B2 * | 11/2018 | Ding | G05D 7/0635 |
| 10,353,408 B2 * | 7/2019 | Ding | G05D 7/0635 |
| 10,649,471 B2 * | 5/2020 | Ding | C23C 16/45525 |
| 10,651,059 B2 | 5/2020 | Lee | |
| 10,725,484 B2 | 7/2020 | L'Bassi et al. | |
| 2002/0117214 A1 ‡ | 8/2002 | Tucker | G05D 16/2053 137/48 |
| 2002/0148561 A1 ‡ | 10/2002 | Tetsuhiro | C23C 16/455 156/345.26 |
| 2002/0198668 A1 * | 12/2002 | Lull | G05D 7/0635 702/45 |
| 2003/0098069 A1 * | 5/2003 | Sund | G05D 7/0635 137/487.5 |
| 2004/0074311 A1 * | 4/2004 | Lull | G05D 7/0635 73/861 |
| 2004/0226507 A1 ‡ | 11/2004 | Carpenter | C23C 16/52 118/71 |
| 2005/0223979 A1 ‡ | 10/2005 | Shajii | C23C 16/45544 118/69 |
| 2007/0023394 A1 ‡ | 2/2007 | Murakami | H01J 37/32082 216/67 |
| 2007/0240769 A1 ‡ | 10/2007 | Suzuki | G05D 7/0635 137/487.5 |
| 2007/0246102 A1 * | 10/2007 | McDonald | G05D 7/0635 137/487.5 |
| 2008/0102202 A1 ‡ | 5/2008 | Chandrachood | H01J 37/32082 427/248.1 |
| 2009/0053900 A1 ‡ | 2/2009 | Nozawa | C23C 16/45502 438/710 |
| 2009/0061541 A1 ‡ | 3/2009 | Moriya | C23C 16/455 438/10 |
| 2009/0130859 A1 ‡ | 5/2009 | Itatani | C23C 16/0272 438/778 |
| 2010/0049461 A1 * | 2/2010 | Lull | G01F 1/6965 702/100 |
| 2010/0125424 A1 * | 5/2010 | Ding | G01F 25/0053 702/47 |
| 2012/0073672 A1 * | 3/2012 | Ding | C23C 16/45523 137/14 |
| 2012/0076935 A1 * | 3/2012 | Ding | G05D 7/0635 427/248.1 |
| 2012/0216888 A1 * | 8/2012 | Ding | G05D 7/0635 137/561 R |
| 2012/0305188 A1 ‡ | 12/2012 | Kato | H01J 37/3244 156/345.26 |
| 2013/0025786 A1 | 1/2013 | Davdkokivch et al. | |
| 2013/0092257 A1 | 4/2013 | Yasuda et al. | |
| 2013/0255793 A1 ‡ | 10/2013 | Watanabe | F17D 3/00 137/14 |
| 2014/0007950 A1 | 1/2014 | Takijiri | |
| 2014/0083514 A1 ‡ | 3/2014 | Ding | G01F 1/363 137/12 |
| 2014/0182692 A1 | 7/2014 | Hirata et al. | |
| 2014/0190571 A1 ‡ | 7/2014 | Ding | G05D 7/0635 137/1 |
| 2014/0190579 A1 ‡ | 7/2014 | Ding | G05D 7/0635 137/48 |
| 2014/0238498 A1 * | 8/2014 | Ding | G05D 11/132 137/3 |
| 2014/0299204 A1 ‡ | 10/2014 | Somani | G01F 15/003 137/486 |
| 2016/0216713 A1 * | 7/2016 | Mudd | F16K 37/005 |
| 2017/0101715 A1 ‡ | 4/2017 | Nishizato | C23C 16/52 |
| 2017/0167026 A1 ‡ | 6/2017 | Nakada | C23C 16/45561 |
| 2017/0199529 A1 | 7/2017 | Ding | |
| 2019/0056755 A1 ‡ | 2/2019 | Ding | G05D 7/0635 |
| 2019/0243392 A1 ‡ | 8/2019 | Ding | C23C 16/45525 |
| 2020/0042021 A1 ‡ | 2/2020 | Somani | G01M 3/2876 |
| 2020/0073414 A1 | 3/2020 | Lull et al. | |
| 2020/0241578 A9 | 7/2020 | L'Bassi et al. | |

FOREIGN PATENT DOCUMENTS

| | | | | |
|---|---|---|---|---|
| JP | 02-253315 A | | 10/1990 | |
| JP | 2008123085 A | ‡ | 5/2008 | .......... G05D 7/0635 |
| JP | 2008123085 A | | 5/2008 | |
| JP | 2019-070924 A | | 5/2019 | |
| KR | 10-2007-0095240 A | | 9/2007 | |
| WO | 2012044658 A1 | | 4/2012 | |
| WO | 2012050866 A1 | | 4/2012 | |
| WO | WO-2012044658 A1 | ‡ | 4/2012 | ....... C23C 16/45523 |
| WO | WO-2012050866 A1 | ‡ | 4/2012 | ....... C23C 16/45557 |
| WO | 2012116281 A1 | | 8/2012 | |
| WO | WO-2012116281 A1 | ‡ | 8/2012 | .......... G05D 7/0635 |
| WO | WO 2013/109443 A1 | | 7/2013 | |
| WO | WO 2015/123008 A1 | | 8/2015 | |
| WO | 2015138073 A1 | | 9/2015 | |
| WO | WO-2015138073 A1 | ‡ | 9/2015 | ....... C23C 16/45523 |
| WO | 2017040100 A1 | | 3/2017 | |
| WO | WO-2017040100 A1 | ‡ | 3/2017 | .......... G05D 7/0635 |
| WO | WO 2020/050972 A1 | | 3/2020 | |

OTHER PUBLICATIONS

International Preliminary Report on Patentability for Int'l Appl. No. PCT/US2019/047169, titled, "Method and Apparatus for Pulse Gas Delivery Using an External Pressure Trigger," dated Mar. 18, 2021.
International Search Report and Written Opinion of the International Searching Authority for Int. Appl. No. PCT/JS2019/047169 entitled, "Method and Apparatus for Pulse Gas Delivery Using an External Pressure Trigger," dated Dec. 4, 2019.
Extended European Search Report for EP Application 19856859.4 titled Method and Apparatus for Pulse Gas Delivery Using an External Pressure Trigger, dated Apr. 21, 2022.

\* cited by examiner
‡ imported from a related application

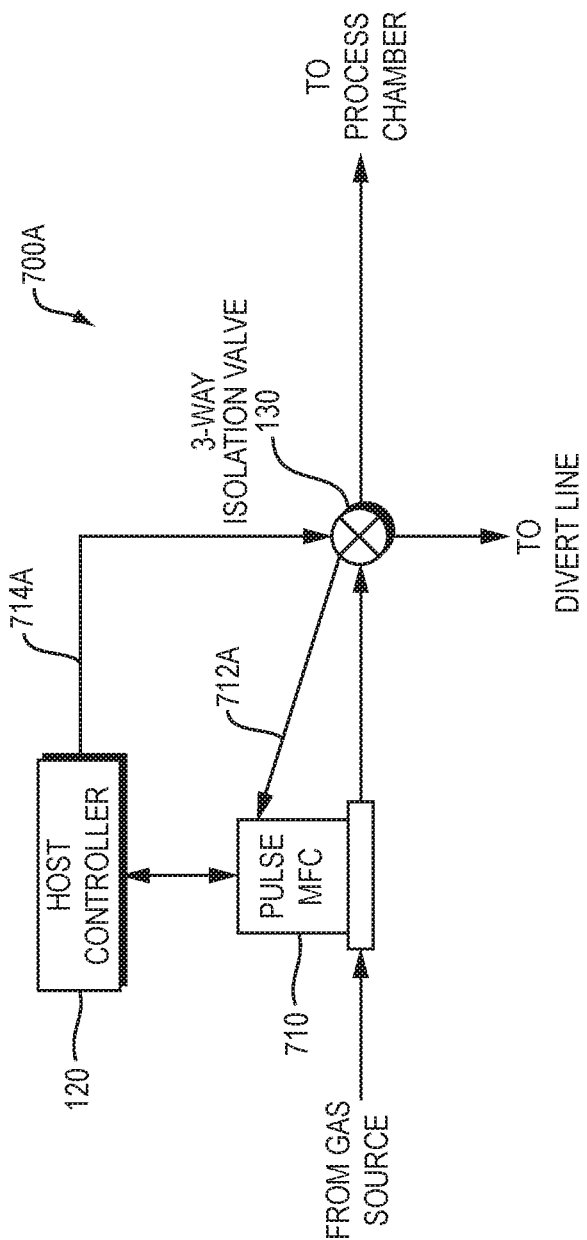

METHOD AND APPARATUS FOR PULSE GAS DELIVERY USING AN EXTERNAL PRESSURE TRIGGER

RELATED APPLICATION

This application is a divisional of U.S. application Ser. No. 16/124,669, filed Sep. 7, 2018. The entire teachings of the above application are incorporated herein by reference.

BACKGROUND

A mass flow controller (MFC) is a device to measure and control the flow of liquids and gases. In general, an MFC includes an inlet port, an outlet port, a mass flow sensor and a proportional control valve that is adjusted to achieve a desired mass flow.

Semiconductor fabrication processes, such as atomic layer deposition (ALD) processes, can involve the delivery of several different gases and gas mixtures in various quantities over several processing steps. Generally, gases are stored in tanks at a processing facility, and gas metering systems are used to deliver metered quantities of gases from the tanks to processing tools, such as chemical vapor deposition reactors, vacuum sputtering machines, plasma etchers, etc. Typically, components such as valves, pressure regulators, MFCs, mass flow ratio control systems, etc. are included in the gas metering system or in a flow path from the gas metering system to a processing tool.

Pulse gas delivery devices have been developed to deliver a pulsed mass flow of a gas to semiconductor process tools.

SUMMARY

A fluid control system for pulse delivery of a fluid includes a shutoff valve and a mass flow controller (MFC) upstream of the shutoff valve. The MFC includes a flow channel, a control valve to control flow of fluid in the flow channel, a flow sensor to measure flow rate in the flow channel, and a controller having a valve input from the shutoff valve indicating opening of the shutoff valve. The controller is configured to respond to the valve input to control flow of fluid through the control valve to initiate and terminate a pulse of fluid from the flow channel to the shutoff valve to control a mass of fluid delivered during the pulse of fluid.

The MFC can be a pressure based MFC or a thermal MFC. The control valve is preferably a proportional valve that produces a flow output that is proportional to a control input (e.g. an electronic control input from a host controller). The proportional control valve can be used to control the flow of fluid passing through the valve orifice. Typical proportional valved used in MFCs include, but are not limited to, solenoid valves and piezo valves. The controller of the MFC can control the flow of fluid through the control valve based on feedback from the flow sensor during the pulse of fluid.

The shutoff valve, located downstream from the MFC, can be a fast response, pneumatically controlled valve. The valve can be a 3-way valve coupled to a process chamber and a divert line. The shutoff valve can be controlled by a host controller.

The valve input to the MFC can be a pressure signal, and the MFC can include a pressure sensor to sense the pressure signal. The pressure sensor can receive the pressure signal via a tap into a pneumatic line, pressure in the line opening and closing the shutoff valve. Generally, the pressure sensor can receive the pressure signal via a pneumatic line controlled by a host controller.

Where the valve input is a pressure signal, the controller of the MFC can be configured to convert a rising edge of the pressure signal into a trigger signal for starting pulse gas delivery.

The controller of the MFC can be configured to calculate a mole set point $n_{SP}$ from flow set point $Q_{SP}$ and a pulse-on period $\Delta t$. The mole set point $n_{SP}$ is a targeted amount of the mass of fluid to be delivered during the pulse of fluid. The pulse-on period $\Delta t$ can be a default value stored in the MFC and the flow set point $Q_{SP}$ can be received from a host controller. The MFC can be programmable to change the pulse-on period $\Delta t$ from the stored default value.

The controller of the MFC can be configured to calculate the mole set point $n_{SP}$ from the flow set point $Q_{SP}$ and the pulse-on period $\Delta t$ according to the following equation:

$$n_{SP} = 0.744 * Q_{SP} * \Delta t \qquad (1).$$

The controller can be configured to close the control valve based on a computation of the mass of fluid delivered and/or the duration of the pulse-on period $\Delta t$ during the pulse of fluid.

For example, the controller can be configured to determine an estimated number of moles of fluid delivered as a function of i) the measured flow rate, ii) a start time of the pulse of fluid, and iii) a stop time of the pulse of fluid. The controller can control the flow through the control valve based on the estimated number of moles of fluid delivered during the pulse.

The controller can be configured to determine the actual number of moles of fluid delivered according to the following equation:

$$\Delta n = \int_{t_1}^{t_2} Q \cdot dt, \qquad (2)$$

where $\Delta n$ is the actual number of moles delivered during a pulse period, $Q$ is the measured flow rate by the flow sensor, $t_1$ is the start time of the pulse, and $t_2$ is the stop time of the pulse.

A method of delivering a pulse of fluid includes controlling flow of fluid into a flow channel with a control valve; measuring flow rate in the flow channel with a flow sensor; receiving a valve input from a shutoff valve downstream of the control valve indicating opening of the shutoff valve; and responding to the valve input to control flow of fluid through the control valve to initiate and terminate a pulse of fluid from the flow channel to the shutoff valve to control a mass of fluid delivered during the pulse of fluid.

Controlling the flow of fluid through the control valve can be based on feedback from the flow sensor during the pulse of fluid.

Receiving the valve input can include sensing a pressure signal received via a tap into a pneumatic line, pressure in the line opening and closing the shutoff valve.

The method of delivering a pulse of fluid can include receiving a flow set point $Q_{SP}$; and calculating a mole set point $n_{SP}$ from a flow set point $Q_{SP}$ and a pulse-on period $\Delta t$, the mole set point $n_{SP}$ being a targeted amount of the mass of fluid to be delivered during the pulse of fluid. The method of delivering a pulse of fluid can further include controlling opening and closing of the shutoff valve.

In an embodiment, a mass flow controller (WC) for pulse delivery of a fluid includes a flow channel, a control valve to control flow of fluid in the flow channel, a flow sensor to measure flow rate in the flow channel, and a controller having a valve input from a shutoff valve downstream of the control valve indicating opening of the shutoff valve. The controller is configured to respond to the valve input to control flow of fluid through the control valve to initiate and terminate a pulse of fluid from the flow channel to the shutoff valve to control a mass of fluid delivered during the pulse of fluid.

In an embodiment, a mass flow controller (WC) for pulse delivery of a fluid includes a flow channel, a control valve to control flow of fluid in the flow channel, a flow sensor to measure flow rate in the flow channel, and a controller having an input and being configured to calculate a mole set point $n_{SP}$ from a flow set point $Q_{SP}$ and a pulse-on period $\Delta t$. The controller is configured to respond to the input to control flow of fluid through the control valve to initiate and terminate a pulse of fluid from the flow channel to control a mass of fluid delivered during the pulse of fluid, the pulse of fluid being terminated in response to the calculated mole set point $n_{SP}$.

In an embodiment, a method of delivering a pulse of fluid includes receiving a flow set point $Q_{SP}$, calculating a mole set point $n_{SP}$ from the flow set point $Q_{SP}$ and a pulse-on period $\Delta t$, controlling flow of fluid into a flow channel with a control valve, measuring flow rate in the flow channel with a flow sensor, and responding to an input to control flow of fluid through the control valve to initiate and terminate a pulse of fluid from the flow channel to control a mass of fluid delivered during the pulse of fluid, the pulse of fluid being terminated in response to the calculated mole set point $n_{SP}$.

In an embodiment, a mass flow controller (WC) for pulse delivery of a fluid includes a flow channel, a control valve to control flow of fluid in the flow channel, a flow sensor to measure flow rate in the flow channel, a pressure sensor to sense an external pressure signal, and a controller configured to respond to the external pressure signal to control flow of fluid through the control valve based on feedback from the flow sensor to initiate and terminate a pulse of fluid from the flow channel to control a mass of fluid delivered during the pulse of fluid.

In an embodiment, a method of delivering a pulse of fluid includes controlling flow of fluid into a flow channel with a control valve, measuring flow rate in the flow channel with a flow sensor, sensing an external pressure signal, and responding to the external pressure signal to control flow of fluid through the control valve based on feedback from the flow sensor to initiate and terminate a pulse of fluid from the flow channel to control a mass of fluid delivered during the pulse of fluid.

Embodiments of the invention can include one or more of the following features:

(1) Using an external pressure as a trigger signal to start pulse gas delivery;

(2) Tapping into an existing pneumatic line for a downstream positive shutoff valve and directing a pressure signal into a pulse gas delivery device (e.g., pulse MFC) for pulse delivery;

(3) Converting the pressure rising/falling edge into a trigger signal for the pulse gas delivery device to start the pulse gas delivery process;

(4) Using the flow setpoint and the pulse-on duration to determine the mole dose setpoint in a pulse;

(5) Recognizing closure of the pneumatically actuated downstream valve to indicate time the delivery process had to complete; and (6) Reporting, by the pulse delivery device, success or failure of delivery in addition to details of delivery.

In a prior approach for pulse gas delivery, a mass flow controller (MFC) is operated in a constant flow mode and a host controller switches a downstream three-way valve in order to divert the flow into the process chamber and the dump line in pulses. Among the disadvantages of this prior approach is that it wastes expensive process gas when the gas is diverted into the dump line during the pulse gas delivery process.

Embodiments of the invention provide several advantages over prior methods of pulse gas delivery. Embodiments include a configuration of a pulse gas delivery MFC with an external pressure trigger to control delivery of a pulse of fluid. The external pressure trigger can come from a pneumatic line that controls a downstream valve. Because the pulse MFC is operating in pulse delivery mode and uses feedback to estimate the amount of gas delivered, precise mole amounts of gas in pulses can be delivered into a processing chamber, minimizing or eliminating waste of process gas. Further, there is typically only minimum upgrade change on the existing processing tools that use a constant flow and valves with dump lines to deliver gas pulses. Embodiments can provide a pulse gas delivery solution which can be retrofit into existing process tools with minimum software and hardware change.

It should also be appreciated that the various features of the embodiments described may be combined in various ways to produce numerous additional embodiments. Moreover, while various materials, dimensions, shapes, processes, signals, types of flow sensors, types of valves, etc. have been described for use with the disclosed embodiments, others besides those disclosed may be utilized without extending the scope of the invention.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 7A is a schematic illustration of a fluid delivery system including a pulse MFC device having a valve input from a downstream shutoff valve.

DETAILED DESCRIPTION

A description of example embodiments follows.

Fluid control systems and associated devices and methods for pulse delivery of a fluid, e.g. a process gas in a semiconductor manufacturing process or chemical process, are provided. The fluid control systems include a mass flow controller (MFC) and a shutoff valve positioned downstream from the MFC. A controller of the MFC is configured to respond to a valve input to control flow of fluid through a control valve of the MFC to initiate and terminate one or more pulses of fluid from a flow channel to the shutoff valve to control mass of fluid delivered during the pulse of fluid.

An industrial process may require a desired number of moles of a fluid to be delivered during a pulse of fluid being delivered to a process chamber.

The 'mole' is the unit of measurement for amount of substance in the International System of Units (SI) having a unit symbol mol. A 'mole' is defined as the amount or sample of a substance that contains as many constitutive particles, e.g., atoms, molecules, ions, electrons, or photons, as there are atoms in 12 grams of carbon-12 (12C), the isotope of carbon with standard atomic weight 12. This number is expressed by the Avogadro constant, which has a value of approximately $6.022140857 \times 10^{23}$ mol-1. The mole is widely used as a convenient way to express amounts of reactants and products of chemical reactions. The molar volume (symbol $V_m$) is the volume occupied by one mole of a substance at a given temperature and pressure. It is equal to the molar mass (M) divided by the mass density ($\rho$).

Previous approaches to pulse gas delivery include turning flow of gas on and off on a MFC by a host controller. Another prior approach uses charge and discharge volume to deliver pulses by measuring the volume pressure. The disadvantages of these previously known approaches include the high work load that is put on the host controller, which must calculate and adjust flow rate to deliver the required amount of gas. As the pulse width becomes short, the communication jittering between the host controller and the MFC degrades the performance of pulse gas delivery in terms of repeatability and accuracy. The pulse shape is not ideal for prior pulse MFCs, especially for pressure based pulse MFCs, which tend to have long tails (see, e.g., FIG. 6 and associated description).

Figure 1:
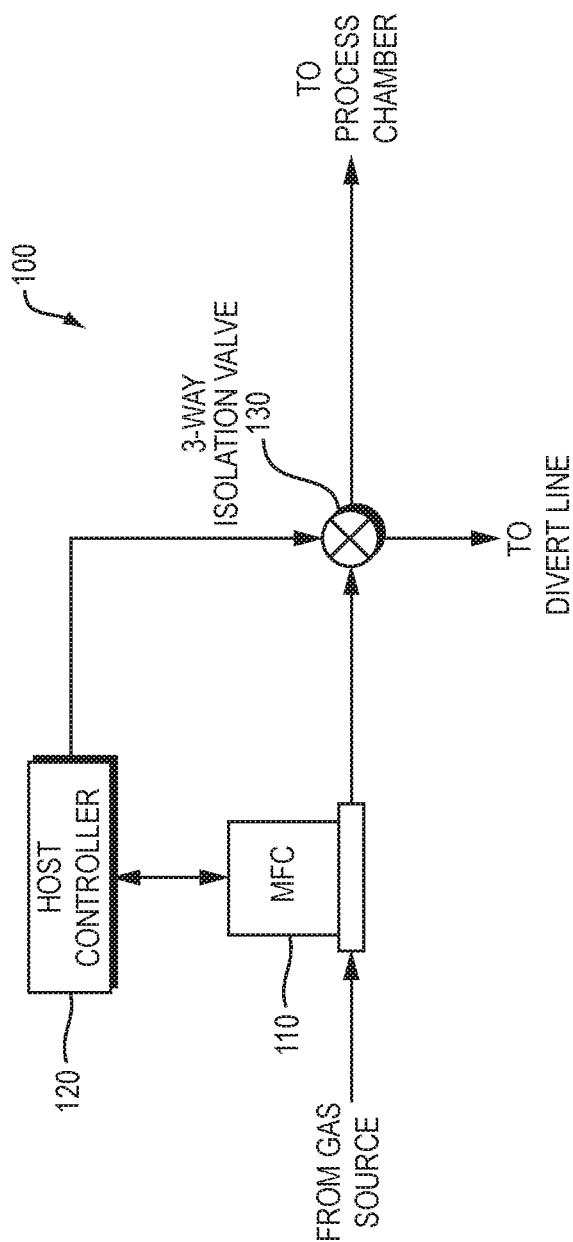
FIG. 1 illustrates a prior pulse gas delivery system using a mass flow controller (MFC), a 3-way isolation valve, and a divert line.

FIG. 1 illustrates a prior pulse gas delivery system 100 using a thermal mass flow controller (MFC) 110, a host controller 120, and a 3-way valve 130 connected to a divert line and a process chamber. A host controller 120 instructs the MFC 110 to provide a constant flow rate of gas from a gas source and activates the 3-way valve 130 to switch the flow to the process chamber or to the divert line based on desired pulse duration times. The system 100 does not use feedback of how much gas is actually delivered to the process chamber. A drawback of pulse gas delivery systems such as system 100 is that the pulse accuracy and repeatability are dependent on the shut-off valve, e.g., 3-way valve 130. Further, the MFC in such a system is always flowing gas, wasting process gas through the divert line, which is undesirable because process gas can be expensive.

Figure 2B:
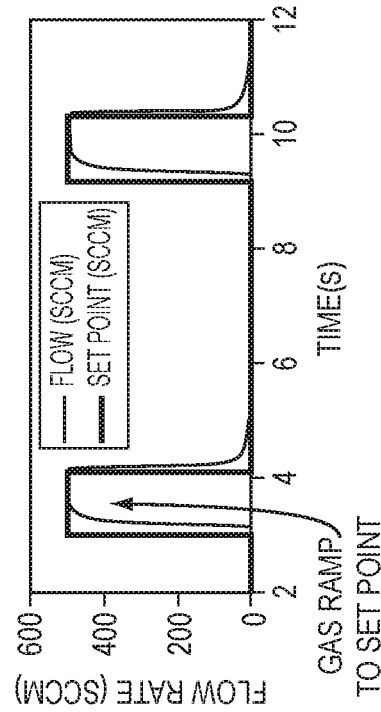
FIGS. 2A-2B illustrate a prior pulse gas delivery system employing a fast response MFC.
Figure 2A:
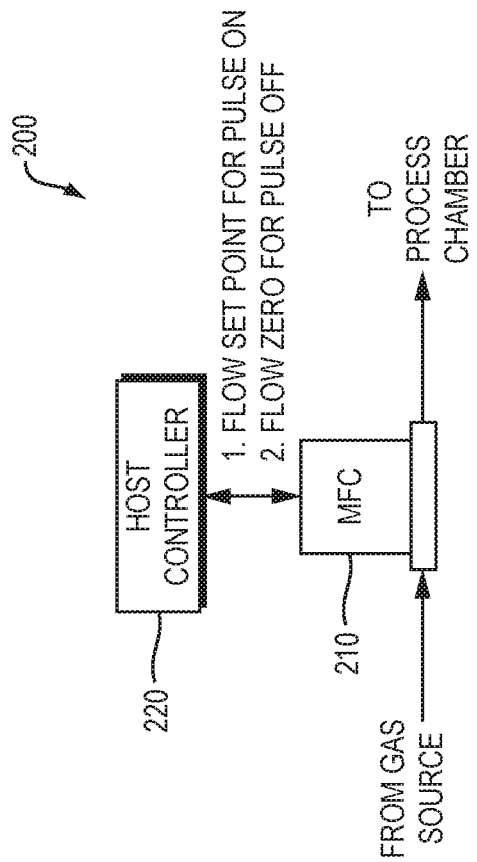

FIG. 2A illustrates a prior pulse gas delivery system 200 employing a fast response, thermal MFC 210, such as a thermal MFC based on microelectromechanical system (MEMS) technology. A host controller 220 directly controls the pulse delivery using standard flow rate control. The standard flow rate control mode can include the following processing steps:

a) To initiate flow, the host controller sends flow set point Q at the desired pulse start time ($t_1$).
b) To stop flow, the host controller sends a zero ("0") flow set point at the desired stop time ($t_2$).
c) Repeat the above "n" times for desired number of pulses beginning at time ($t_3$).

FIG. 2B is a graph illustrating an example of desired flow rate ("set point") and actual flow rate ("flow") using the system 200 of FIG. 2A in standard rate control mode.

There are several drawbacks to the prior approach illustrated in FIGS. 2A-2B. The MFC shows fast control (e.g., <500 msec), but it may not be fast enough for certain atomic layer deposition (ALD) and through-silicon via (TSV) process requirements. The MFC responds to set points, but does not adjust for initial gas ramp to the set point. The delivery is time based only. There is no feedback of actual amount of gas delivered. Furthermore, digital communications "jitter" between the host controller 220 and the MFC 210 can impact repeatability of the pulse delivery. Also, a thermal MFC that is fast but based on MEMS technology may not be compatible with corrosive gases.

Figure 3B:
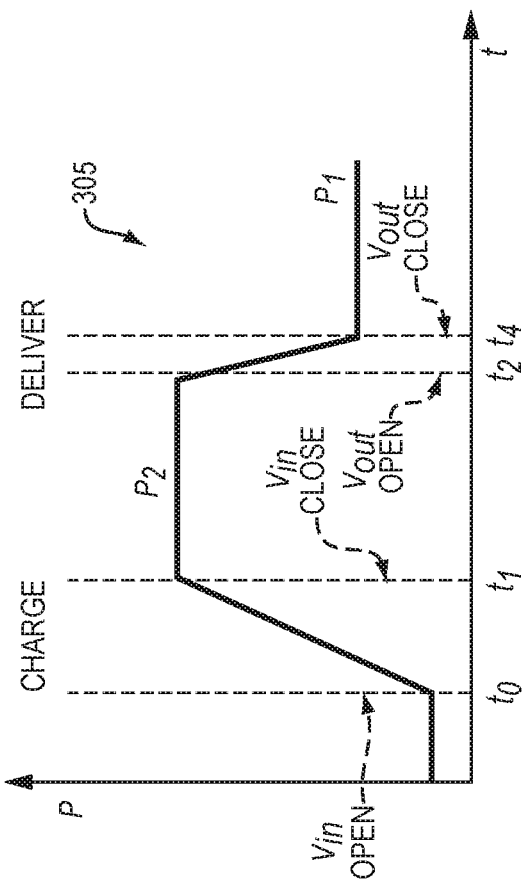
FIGS. 3A-3B illustrate a prior pulse gas delivery system using rate of decay pulse delivery.
Figure 3A:
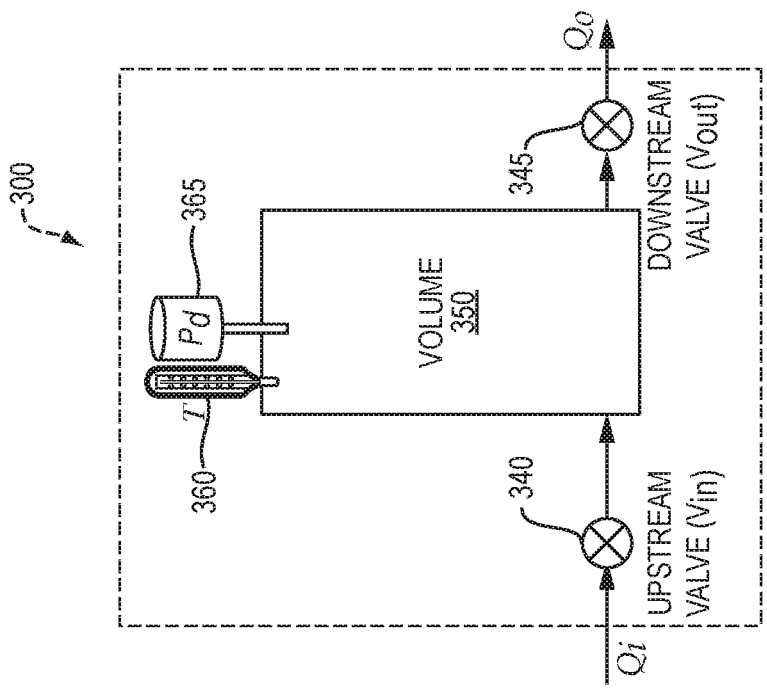

FIG. 3A illustrates a prior pulse gas delivery device 300 using pressure-volume-based pulse gas delivery. Pressure-volume based mole measurement techniques are known in the art and make use of a pressure (P) vs. time (t) response 305 of a gas introduced into a known volume, as illustrated in FIG. 3B. Device 300 includes a chamber 350 providing a known volume, a valve 340 located upstream ("Vin") of the chamber 350, and a valve 345 located downstream ("Vout") of the chamber 350. Also provided are a pressure sensor 365 positioned at chamber 350 and a temperature sensor 360.

Initially, the device 300 may be charged by opening upstream valve 340, while downstream valve 345 is closed, allowing a flow of gas ($Q_i$) to enter the device to fill the chamber 350 over a period of time ("Charge" period $\Delta t = (t_1 - t_0)$, FIG. 3B) and a change in pressure to occur. At time $t_1$ and pressure $P_2$, the upstream valve 340 is closed ("Vin CLOSE"). The process then includes a period ($t_2 - t_1$) in which the gas in the chamber 350 is allowed to stabilize to a set point. During this period, pressure and temperature measurements are obtained, e.g., by pressure sensor 365 and temperature sensor 360. Upon opening of the downstream valve 345 ("Vout OPEN" at time $t_2$, FIG. 3B), a flow of gas ($Q_o$) exits the device 300 until the valve 345 is closed again ("Vout CLOSE" at time $t_4$), delivering a pulse of gas from the device to a processing tool over a period of time ("Deliver" period $\Delta t = t_4 - t_2$,) and a change in pressure ($\Delta P = P_1 - P_2$).

Pressure-volume based mole measurement methods and devices are further described in U.S. patent application Ser. No. 13/626,432, published on Mar. 27, 2014 as US 2014/0083514A1, now issued as U.S. Pat. No. 10,031,005 B2 in the name of Ding, the entire contents of which are incorporated herein by reference. Multiple channel pulse gas delivery employing flow rate determined based on a pressure drop within in a delivery chamber is described in U.S. Pat. No. 9,348,339 B2, issued May 24, 2016 to Ding et al., the entire contents of which are incorporated herein by reference. Further examples of systems for and methods of fast pulse gas delivery are described in U.S. Pat. No. 8,997,686 B2, issued Apr. 7, 2015 to Ding, and U.S. Pat. No. 10,031, 531 B2, issued Jul. 24, 2018 to Ding, the entire contents of which are incorporated herein by reference.

The pulse gas delivery illustrated in FIG. 3B can be implemented by a program on a controller of device 300 that executes a delivery recipe. The pulse delivery is initiated by a trigger signal, e.g., a control signal from a host controller. The delivered gas can be estimated based on the principal of ideal gas law, $\Delta n=(\Delta P*V)/(R*T)$.

The approach illustrated in FIGS. 3A-3B has several limitations. The accuracy and repeatability of pulse delivery are dependent on the speed and reliability of the downstream shut-off valve. A shut-off valve with a fast response time is desired. If the valve is aging, however, one may need to implement adaptive adjusting, which adds complexity, or one may need to replace the valve, which typically requires an interruption in the process. Often, the pulse shape (e.g., the pulse width) is not as desired or the pulse does not match the desired square wave sufficiently. Further, the need to charge the chamber 350 with a volume of gas requires time. The gas charge time and stabilization time prior to each pulse limit rapid gas delivery cycle time.

However, an advantage of pressure-volume based mole measurement techniques is that they can be applied without knowledge of the specific gas or gas mixture being measured. The gas flow rate, which is derived from a mass balance over the chamber volume and an application of the ideal gas law, is gas independent, relying on the three state variables of pressure (P), temperature (T), and volume (V) to characterize the behavior of the gas being measured.

Figure 4:
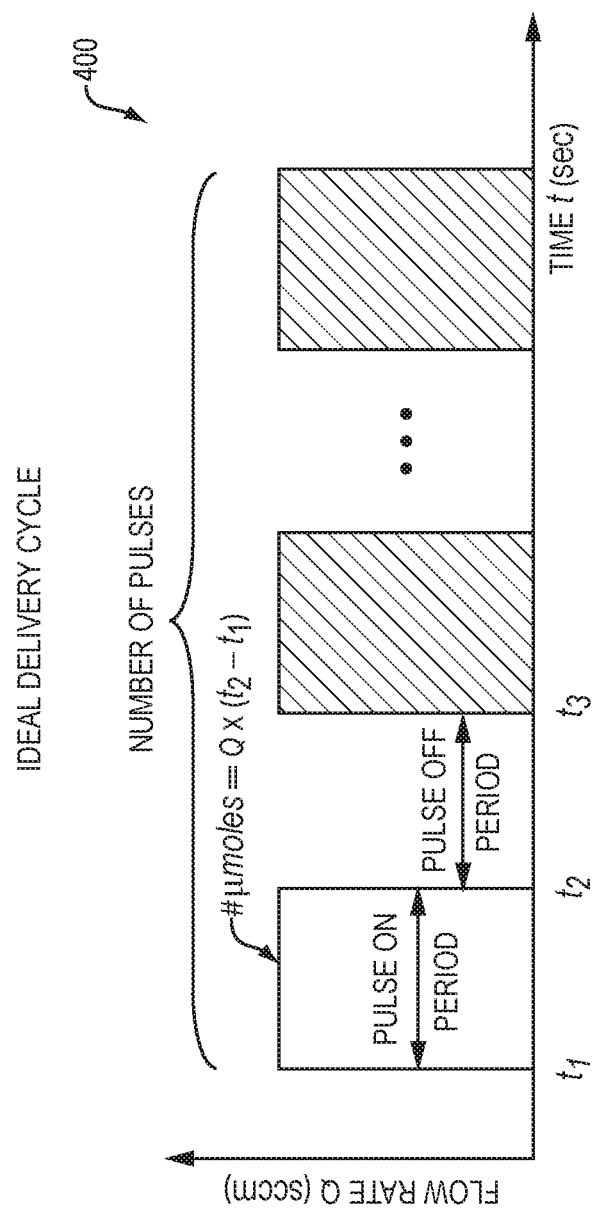
FIG. 4 illustrates pulse delivery employing gas dose defined by product of flow set point (Q) and deliver time ($\Delta t$).

FIG. 4 illustrates pulse delivery employing a gas dose defined by the product of ideal square shape flow set point (Q) and deliver time ($\Delta t$). A gas delivery cycle 400 can be specified by a 'pulse-on' period ($t_2-t_1$), a 'pulse-off' period ($t_3-t_2$), a gas dose (e.g., number of moles of gas per pulse), and a number of pulses per cycle. For pulse delivery, the gas mole dose can be defined as: ideal flow set point (Q)×deliver time ($\Delta t=t_2-t_1$), or more precisely by Equation 2.

A step function delivery of flow as illustrated in FIG. 4 is ideal but unrealistic due to actual sensor and valve time constants. For practical applications, accuracy and repeatability of dose in the required timeframe are the critical objectives. Thus, it is desirable to accurately and repeatability deliver the gas. To this end, one can use an MFC's computational capability to calculate and adjust flow rate to deliver the required amount of gas in the specified time. The MFC can be configured to compute the actual delivered gas dose and regulate it to the targeted pulse gas dose. The MFC can maintain the area under the flow rate curve, i.e. $Q\times\Delta t$ or as provided by Equation 2.

Figure 5:
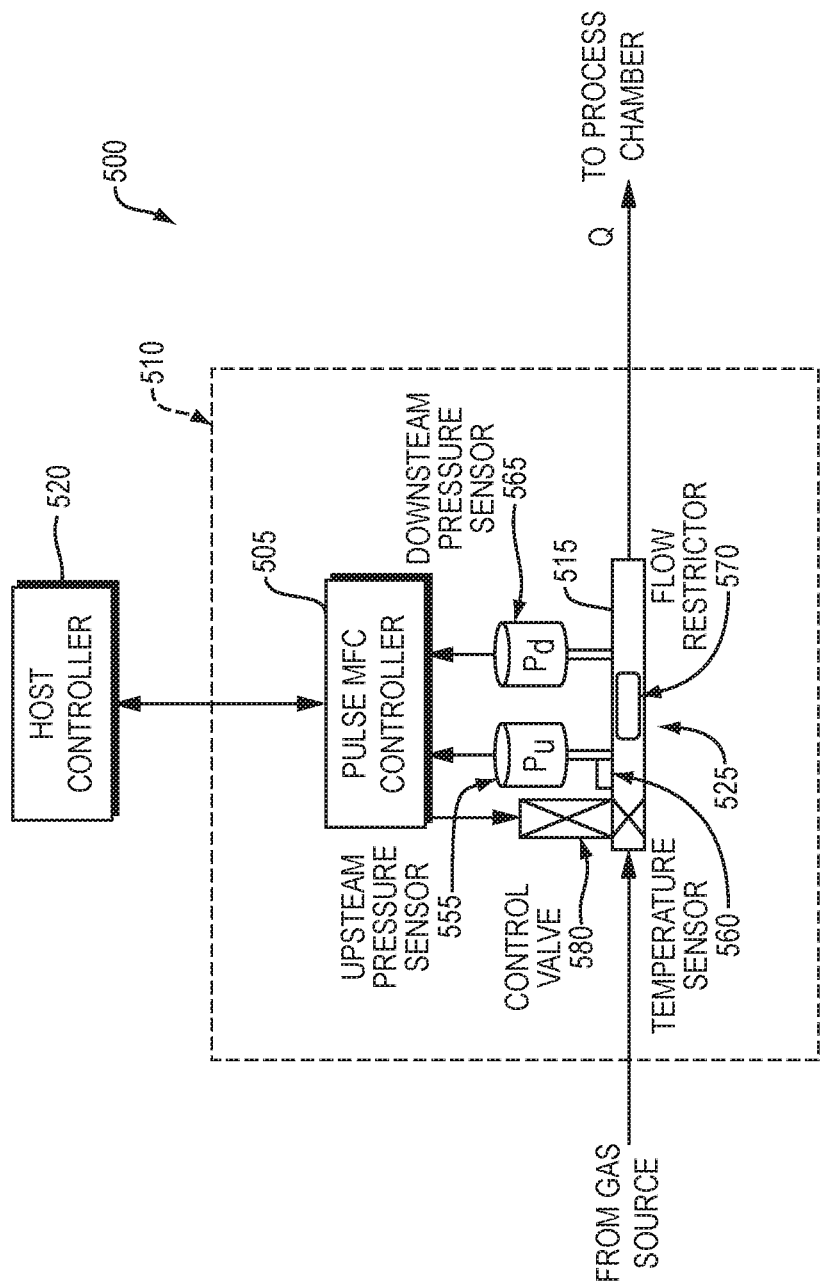
FIG. 5 is a schematic illustration of a prior pressure-based pulse MFC device.

FIG. 5 illustrates a prior system 500 for pulse delivery of a gas. The system 500 includes a pressure-based MFC 510 configured for pulse delivery. A host controller 520 communicates with the MFC 510, e.g., to provide information regarding the desired pulse delivery information, such as pulse mole setpoint, pulse on period, pulse off period and number of repeated pulses, to the MFC 510. To initiate a pulse delivery cycle, the host controller 520 sends a trigger signal to the MFC 510. The MFC 510 includes a control valve 580 (e.g., a proportional control valve) to control flow of fluid from a gas source into a flow channel 515. A controller 505 of the MFC 510 is configured to control flow of fluid through the control valve 580 to control fluid delivered to a process chamber during the pulse of fluid. The controller 505 controls the flow of fluid through the control valve 580 based on feedback from a flow sensor 525, which is provided to measure flow rate (Q) in the flow channel. The flow sensor 525 includes a flow restrictor 570 within the flow channel 515 and upstream and downstream pressure sensors 555 and 565, respectively. The control valve 580 is upstream from the restrictor 570 and the pressure sensors.

The pulse gas delivery amount can be calculated in accordance with Equation 2, reproduced here:

$$\Delta n = \int_{t_1}^{t_2} Q \cdot dt, \qquad (2)$$

where $\Delta n$ is the delivered gas in mole, Q the measured flow rate by the flow sensor, $t_1$ the start time of the pulse, $t_2$ the end time of the pulse.

Pressure-based pulse MFC gas delivery is further described in International Patent Publication No. WO 2012/116281 A1, entitled "System For And Method Of Fast Pulse Gas Delivery" by Junhua Ding et al., the entire contents of which are incorporated herein by reference.

Further examples of pulse mass flow delivery systems can be found in U.S. patent application Ser. No. 14/209,216, entitled "System For And Method Of Fast Pulse Gas Delivery," filed Mar. 13, 2014 in the names of Junhua Ding, Michael L'Bassi and Tseng-Chung Lee, published as US 2014/0190571 A1, the entire teachings of which are incorporated herein by reference.

The prior approach requires that the host controller send either a digital or an analog trigger signal to a pulse MFC in order to start the pulse gas delivery process. It can be difficult for users to retrofit existing process tools with a pulse MFC of the prior approach, because doing so requires software and hardware changes.

Figure 6:
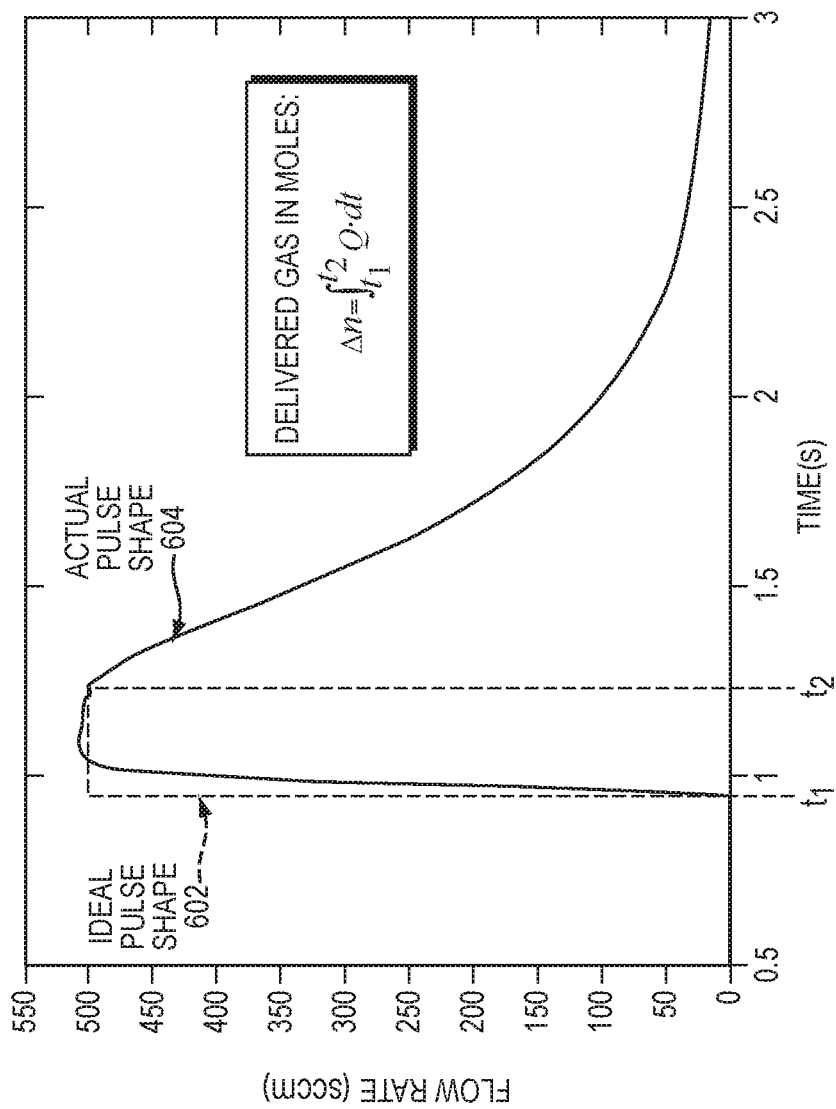
FIG. 6 is a graph illustrating a pulse shape of a gas pulse delivered using an MFC device as illustrated in FIG. 5.

FIG. 6 shows a graph of pulse delivery using the system 500 of FIG. 5. Flow rate is plotted as a function of time for an actual pulse shape 604 superimposed on an ideal pulse shape 602. The ideal pulse has a pulse width of 300 ms. The area under the curve represents the moles of gas delivered. There is a large transient response (e.g., a tail) in the actual pulse delivered, which can be attributed to the volume between the sensor (e.g., downstream pressure sensor 565) and the control valve 580. When the control valve 580 closes, to terminate a pulse, gas that is in the flow channel 515 continues to flow from the MFC. Any residual gas can be diverted by a downstream shutoff valve to a divert line (see FIG. 1) to avoid flowing the gas to the process chamber. If the pulses to be delivered are relatively long in duration, transient flow may not be so important. If the pulses are short, however, the transient flow can be problematic. MFCs are typically calibrated in steady state. The transient response of the MFC control valves, however, can be different from valve to valve.

Figure 7B:
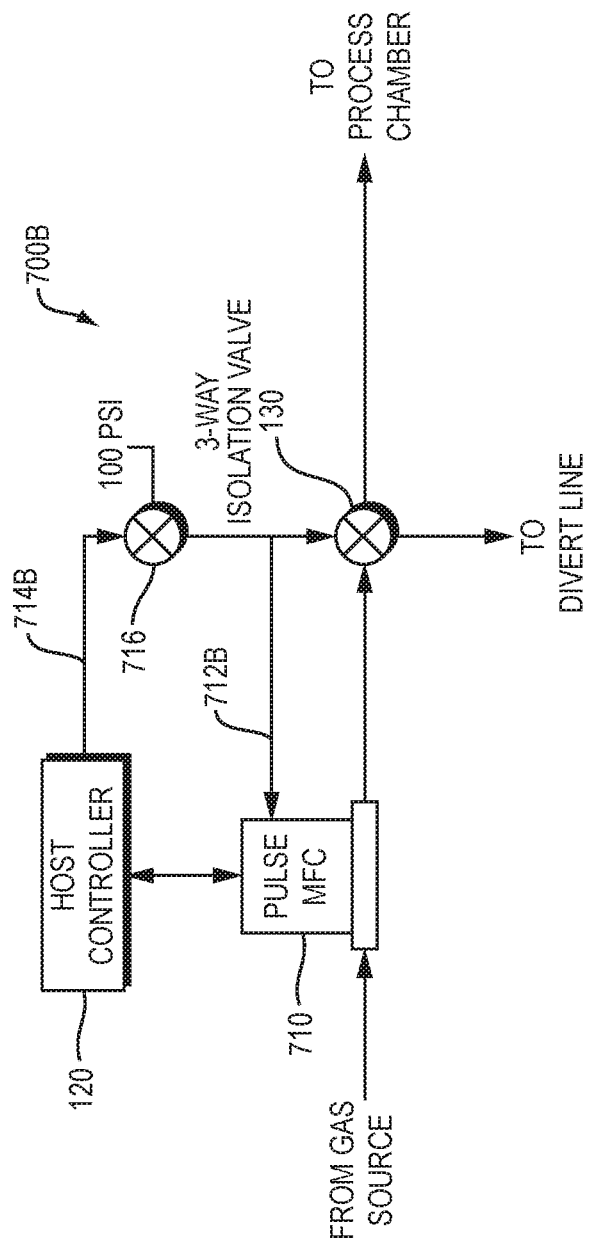
FIG. 7B is a schematic illustration of a fluid delivery system including a pulse MFC device with a pressure signal input received via a tap into a pneumatic line to a downstream valve.

FIG. 7A is a schematic illustration of a fluid control system 700A for pulse delivery of a fluid. System 700A includes pulse MFC device 710 with a valve input 712A from a downstream valve 130. Valve 130 can be a fast response, pneumatic shutoff valve commonly used in an atomic layer deposition (ALD) process (also termed 'ALD valve'). The MFC device 710 controls flow of fluid from a gas source through a flow channel to the downstream valve 130, illustrated here as a 3-way isolation valve. The valve input 712A from the shutoff valve 130 indicates opening of the shutoff valve. In the context of a 3-way valve, opening can mean fluid flow is permitted through one valve outlet, e.g., to the process chamber, but not through the other valve outlet, e.g., to the divert line. A controller in the MFC device 710 is configured to respond to the valve input 712A to control flow of fluid through a control valve of the MFC to initiate and terminate a pulse of fluid from the flow channel to the shutoff valve 130, which in the open state allows fluid to pass to the process chamber, to control a mass of fluid delivered during the pulse of fluid. Opening and closing of valve 130 is controlled by host controller 120 via control signal 714A to valve 130. The control signal 714A can be an electrical control signal. Control of valve 130 may be via an intermediary control valve and a pneumatic control line, as for example illustrated in FIG. 7B. The MFC device 710 communicates with a host controller 120 to coordinate the fluid delivery process. Typically, the MFC device 710 receives a flow set point $Q_{SP}$ from the host controller 120 as described herein.

The controller of the MFC device can be configured to calculate a mole set point $n_{SP}$ from flow set point $Q_{SP}$ and a pulse-on period $\Delta t$, the mole set point $n_{SP}$ being a targeted amount of the mass of fluid to be delivered during the pulse of fluid. The pulse-on period $\Delta t$ can be a default value stored in the MFC and the flow set point $Q_{SP}$ can be received from a host controller. The MFC can be programmable to change the pulse-on period $\Delta t$ from the stored default value.

FIG. 7B is a schematic illustration of fluid control system 700B for pulse delivery of a fluid. As in system 700A, a pulse MFC device 710 is provided with a valve input, which in system 700B is a pressure signal input 712B received via a tap into a pneumatic control line to downstream valve 130. Pressure in the pneumatic control line opens and closes the downstream valve 130. In operation, host controller 120 sends a control signal 714B to a pneumatic control valve 716 to trigger the pneumatic control valve to pass pressure, e.g., 100 PSI, to the downstream valve 130 for a duration of time. Typically, the duration of time corresponds to the desired pulse-on period for the delivery of the fluid pulse. The host controller 120 may control a pneumatic distribution panel having a plurality of pneumatic control valves, e.g., 50-60 valves. In FIG. 7B, only one pneumatic control valve 716 is illustrated for simplicity, but it is understood that additional valves may be present as part of a pneumatic distribution panel.

Figure 7C:
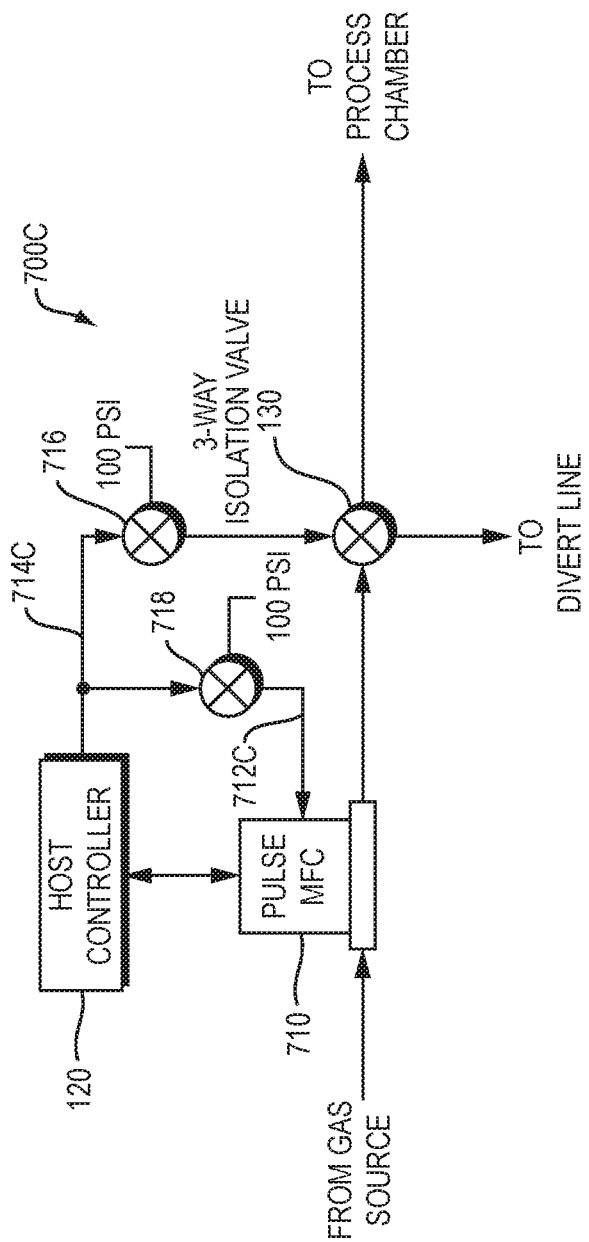
FIG. 7C is a schematic illustration of a fluid delivery system including a pulse MFC device with a pressure signal input received via a pneumatic line controlled by a host controller.

FIG. 7C is a schematic illustration of fluid control system 700C for pulse delivery of a fluid. As in system 700B, a host controller 120 controls opening and closing of the downstream valve 130 and a pulse MFC device 710 is provided with an external pressure signal input to trigger pulse delivery. In system 700C, the MFC device 710 receives a pressure signal input 712C via a pneumatic line from a control valve 718 that is controlled by the host controller 120. A control signal 714C to pneumatic control valve 718 triggers the pneumatic control valve 718 to pass pressure, e.g., 100 PSI, to the pulse MFC device 710. A pressure sensor of the MFC 710 senses the pressure signal, which triggers pulse delivery by the pulse MFC device 710. A control signal 714C from the host controller 120 to a pneumatic control valve 716 triggers the pneumatic control valve 716 to pass pressure, e.g., 100 PSI, to the downstream valve 130 to actuate the valve. In general, pneumatic control valves 716 and 718 can be controlled via one or more control signals 714C from the host controller. For example, valves 716 and 718 may be simultaneously controlled via a common control signal 714C. Pneumatic control valves 716 and 718 can be part of a pneumatic distribution panel, as previously described.

In addition to the embodiments illustrated in FIGS. 7A-7C, some other way to sense the state of the ALD valve can be implemented. For example, a position switch on the ALD valve may provide feedback of the state of the ALD to allow the MFC to sense that the ALD valve is open.

Figure 8:
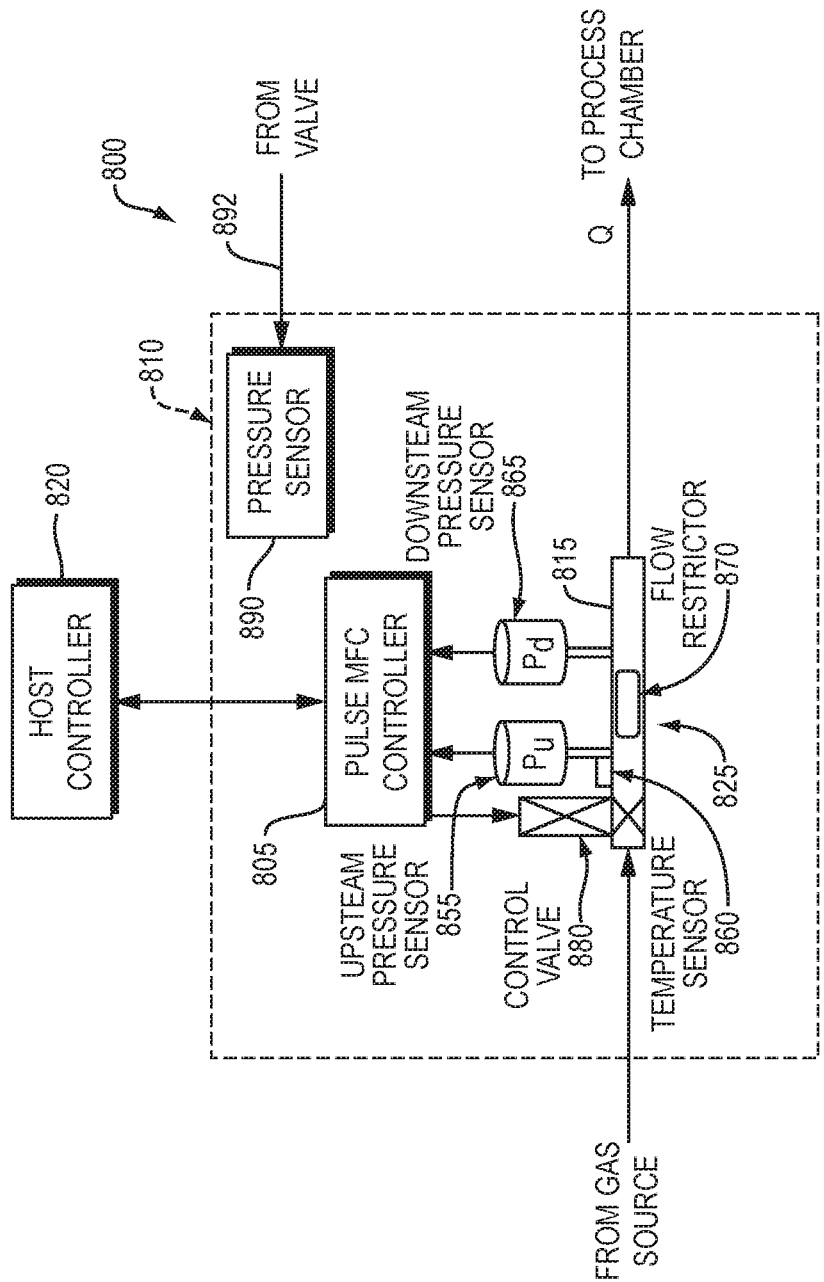
FIG. 8 is a schematic illustration of an embodiment of a pulse MFC device including a pressure sensor to sense an external pressure signal.

FIG. 8 is a schematic illustration of an embodiment of a system 800 that includes a pulse MFC device 810 including a pressure sensor 890 to sense an external pressure signal. The pneumatic pressure change of the downstream ALD valve (see FIGS. 1, 7A, 7B) is used to trigger pulse delivery on the pulse gas delivery device 810. Pressure sensor 890 is added to the pulse gas delivery device, which is configured to detect the pneumatic control pressure change of the downstream ALD valve. The pressure sensor 890 can be built-in to the MFC device and operationally connected to the MFC controller 805 to sense an external pressure signal that is received via a pneumatic line 892 feeding into the MFC device. The device 810 is configured to communicate with a host controller 820 to receive a flow set point. The pulse-on period ($\Delta t$ in seconds) for pulse delivery can be preconfigured in a default value on the device 810 but can be reconfigured to another value through a web browser interface or some other suitable method. The flow setpoint $Q_{SP}$ (in sccm) can be used to calculate the mole dose setpoint $n_{SP}$ (in micro-moles) according to Equation 1, reproduced here:

$$n_{SP}=0.744*Q_{SP}*\Delta t \qquad (1),$$

where $\Delta t$ is the (preconfigured) pulse-on period and 0.744 is a unit conversion factor.

The MFC 810 includes a control valve 880 (e.g., a proportional control valve) to control flow of fluid from a gas source into a flow channel 815. A controller 805 of the MFC 810 is configured to control flow of fluid through the control valve 880 to control fluid delivered to a process chamber during the pulse of fluid. The controller 805 controls the flow of fluid through the control valve 880 based on feedback from a flow sensor 825, which is provided to measure flow rate (Q) in the flow channel. The flow sensor 825 includes a flow restrictor 870 within the flow channel 815 and upstream and downstream pressure sensors 855 and 865, respectively. The control valve 880 is upstream from the restrictor 870 and the pressure sensors. Unlike the host controller 520 in system 500 (FIG. 5), the host controller 820 of system 800 need not send a trigger signal to the MFC 810 to initiate a pulse delivery cycle. The trigger signal for MFC 810 is derived from the valve input, e.g., the pressure signal sensed by pressure sensor 890.

Figure 9:
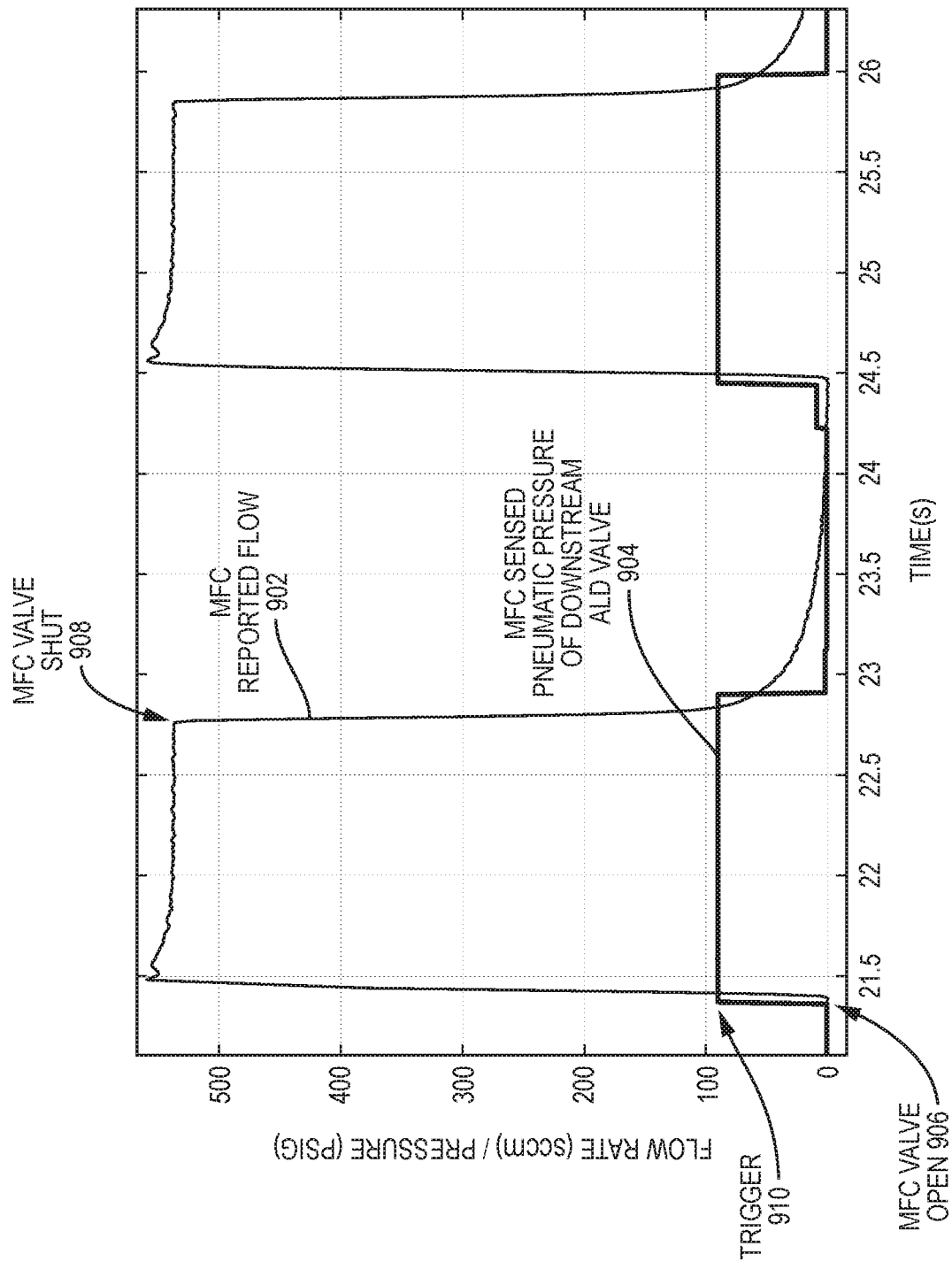
FIG. 9 illustrates using pneumatic pressure of a downstream valve to trigger pulse gas delivery using a pulse MFC.

The pulse gas delivery trigger signal can be detected when the pneumatic pressure is above the pre-determined threshold on the rising edge for the downstream ALD valve to be opened. An example pneumatic control pressure signal is illustrated in FIG. 9 at 904.

The fluid delivery system(s) illustrated in FIGS. 7A, 7B and 8 can provide a pulse gas delivery solution which can retrofit into existing process tools (see FIG. 1) with minimum software and hardware change. For example, the host controller need not be configured to send a trigger signal to the MFC to start pulse delivery.

Multiple pulse MFCs with respective downstream valves can be arranged for multiplexing, as may be required by certain processes.

The fluid delivery systems can also use the pulse MFC to purge the system, e.g., the flow channel or the process chamber. To purge, the MFC is operated in normal MFC mode and a valve open command is sent to the MFC, causing maximum opening of the control valve.

Using mole based pulse delivery, the MFC 810 controls, and adjusts as necessary, the flow set point of control valve 880 and, optionally, the actual pulse-on period so as to control the number of moles delivered with each pulse. Based on these parameters, the MFC 810 automatically delivers one or more pulses of flow in a precise timing sequence, with each pulse delivering Δn moles during the portion of each total pulse period that the MFC is on, and turning the MFC off for the remainder of the total pulse-on-and-off period ($T_{total}$). During pulse delivery, the MFC 810 automatically adjusts the flow set point ($Q_{SP}$) of control valve 880 based on feedback of the estimated number of moles delivered during the pulse in order to precisely deliver the desired number of moles within the targeted pulse-on period ($T_{on}$) for each pulse.

As is known in the art, the flow (Q) through the flow restrictor of the channel can be expressed as a function of the upstream and the downstream pressures ($P_u$ and $P_d$) of the restrictor (i.e., the pressures immediately adjacent to the restrictor), the cross section of the flow path through the restrictor (A), and gas properties such as specific heat ratio γ and molecular weigth MW according to the following equation:

$$Q = f_Q(P_u, P_d, A, \gamma, MW) \quad (3).$$

The function $f_Q$ can be obtained by empirical data or experiment. In the case of a flow nozzle as a flow restrictor, the following equation can be used:

$$Q = C \cdot A \cdot P_u \cdot \left(\frac{R \cdot T}{M} \frac{2\gamma}{\gamma-1}\right)^{1/2} \cdot \left(\frac{P_d}{P_u}\right)^{1/\gamma} \cdot \left[1 - \left(\frac{P_d}{P_u}\right)^{(\gamma-1)/\gamma}\right]^{1/2}, \quad (4)$$

where C is the discharge coefficient of the flow restrictor, R the universal gas constant, and T the gas temperature.

Other flow restrictors and corresponding equations describing mass flow through these flow restrictors can be used, and are known in the art.

Though FIG. 8 illustrates a pressure-based MFC used for pulse gas delivery, the MFC can also be a thermal MFC. For a thermal MFC, the flow sensor is a thermal flow sensor which provides the measurement of flow rate through the MFC.

An existing system having an external isolation valve, such as shown in FIG. 1, can be retrofitted with an improved pulse MFC, such as MFC 710 or MFC 810 (FIGS. 7A, 7B, 8), to control flow through the control valve in response to an input from an downstream isolation valve to provide improved pulse delivery using the method described herein. The improved pulse MFC would not simply control flow over time, as in a standard MFC, but would compute, at mole level, a mass of fluid delivered during a pulse. The host controller simply specifies the flow set point and controls opening/closing of the downstream shutoff valve. The MFC can calculate the number of moles to be delivered per pulse based on the flow set point and a pulse-on period. The host controller may, but need not, specify the number of moles to be delivered per pulse along with other desired process parameters. The MFC controls the pulse delivery cycle locally. In this case, the control valve is controlled based on a calculation of actual moles delivered, as opposed to just based on time. The computation of actual moles delivered should be quick enough and the control signal quick enough to turn off isolation valve to terminate the pulse. This suggests that the computation be done locally, at the MFC.

Operation or function of embodiments of the present invention can include:

(1) A pressure sensor is integrated into the pulse gas delivery device which senses an external pressure;

(2) The external pressure is tapped from a pneumatic line which opens/closes an external valve; or (3) The external pressure can come directly from a pneumatic line controlled by the host controller;

(4) The rising/falling edge of the external pressure is converted into a trigger signal for starting the pulse gas delivery;

(5) The rising/falling edge of the external pressure is detected by a predetermined pressure threshold;

(6) The mole dose setpoint ($n_{SP}$) in a pulse of in a pulse can be determined by the flow setpoint ($Q_{SP}$) and pulse on period (Δt) according Equation 1.

FIG. 9 illustrates initial test results of using pneumatic pressure of a downstream valve to trigger pulse gas delivery using a pulse MFC. The measured flow rate 902 as reported by the MFC is plotted as function of time. Also plotted is the pressure 904 of the downstream ALD valve as sensed by the pressure sensor of the MFC. At 906, the control valve of the MFC is opened in response to a step in the pressure signal 904 indicative of opening of the downstream valve cause. The increase in pressure above a threshold value is a trigger 910 for the MFC to open the control valve. At 908, the control valve is shut causing the MFC reported flow 904 to quickly return to zero. Because the MFC controls flow based on measured flow rate, pulse delivery is immune to transient changes of the downstream valve.

The initial result shown in FIG. 9 demonstrate that the pulse MFC device with external (pressure) input performs as intended, starting and terminating a pulse of fluid in response to the external input. The pulse gas delivery accuracy is sufficiently good, achieving delivery of the desired mole amount. Further, the pulse gas delivery can be completed within the allowable downstream ALD valve open-close period.

Figure 10:
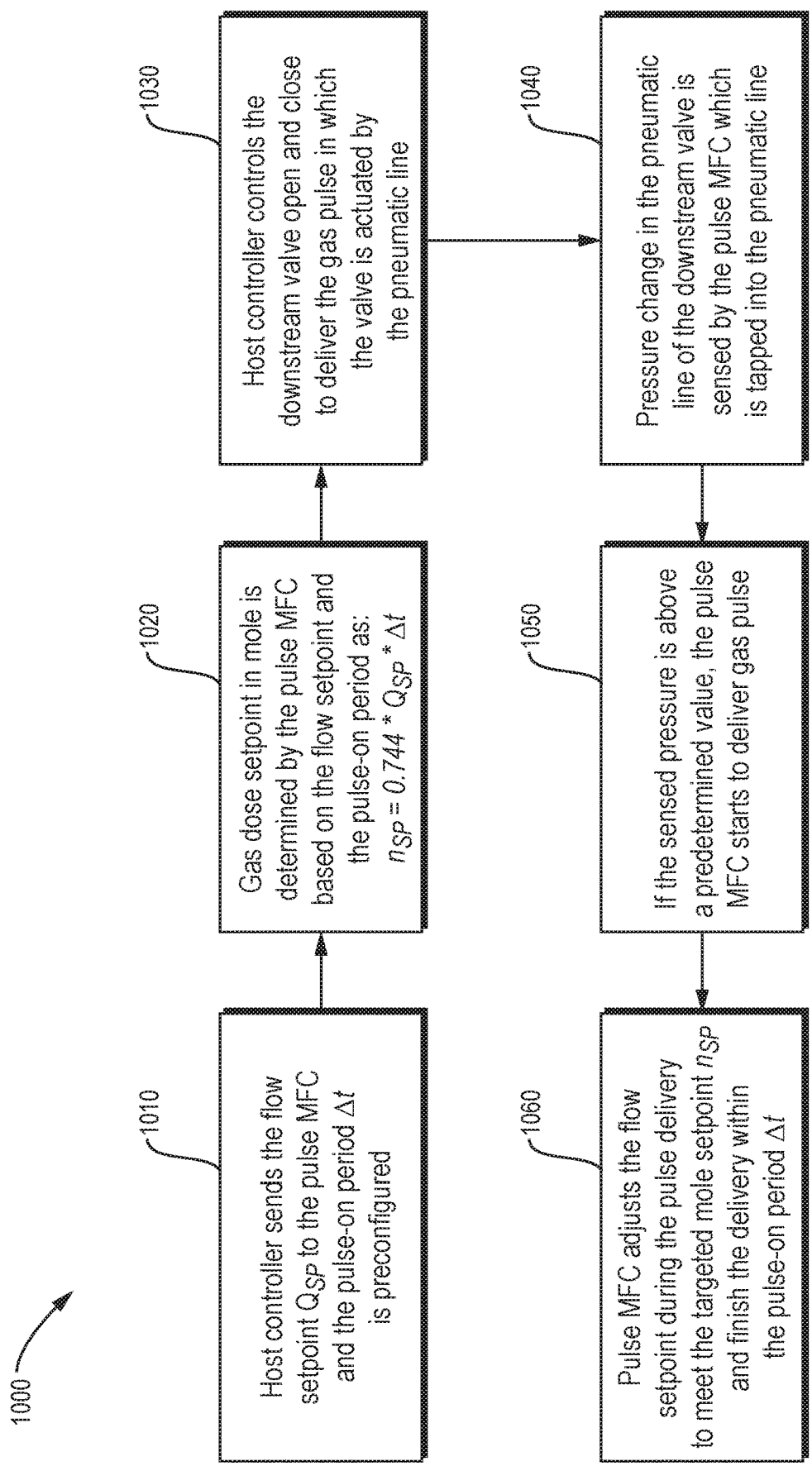
FIG. 10 is a flow diagram of an embodiment of a method of delivering a pulse of fluid.

FIG. 10 is a flow diagram 1000 of an embodiment of a method of delivering a pulse of fluid. At 1010, a host controller sends the flow setpoint $Q_{SP}$ to the pulse MFC. The pulse-on period Δt is preconfigured on the MFC. At 1020, the gas dose setpoint in mole is determined by the pulse MFC based on the flow setpoint $Q_{SP}$ and the pulse-on period Δt, e.g., according to Equation 1. At 1030, the host controller controls the downstream valve open and close to deliver the gas pulse, in which the valve is actuated by the pneumatic line controlled by the host controller. At 1040, pressure change in the pneumatic line of the downstream valve is sensed by the pulse MFC, which is tapped into the pneumatic line. At 1050, if the sensed pressure is above a predetermined value, the pulse MFC starts to deliver gas pulse. At 1060, the pulse MFC adjusts the flow setpoint during the pulse delivery to meet the targeted mole setpoint $n_{SP}$ and finish the delivery within the pulse-on period Δt.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A mass flow controller (MFC) for pulse delivery of a fluid, the MFC comprising:
   a flow channel;
   a control valve to control flow of fluid in the flow channel;
   a flow sensor to measure flow rate in the flow channel; and
   a controller having an external input and being configured to calculate a mole set point $n_{sp}$ from a flow set point $Q_{sp}$ and a pulse-on period $\Delta t$, the controller configured to respond to the external input to control flow of fluid through the control valve to initiate a pulse of fluid from the flow channel to control a mass of fluid delivered during the pulse of fluid, the pulse of fluid being terminated in response to the calculated mole set point $n_{sp}$.

2. The MFC of claim 1, wherein the controller controls the flow of fluid through the control valve based on feedback from the flow sensor during the pulse of fluid.

3. The MFC of claim 1, wherein the external input is a pressure signal, and wherein the MFC includes a pressure sensor to sense the pressure signal.

4. The MFC of claim 3, wherein the pressure sensor is configured to receive the pressure signal via a tap into a pneumatic line, pressure in the pneumatic line opening and closing a shutoff valve.

5. The MFC of claim 3, wherein the pressure sensor is configured to receive the pressure signal via a pneumatic line controlled by a host controller.

6. The MFC of claim 3, wherein the controller is configured to convert a rising edge of the pressure signal into a trigger signal for starting pulse gas delivery.

7. The MFC of claim 1, wherein the mole set point $n_{sp}$ is a targeted amount of the mass of fluid to be delivered during the pulse of fluid.

8. The MFC of claim 7, wherein the pulse-on period $\Delta t$ is a default value stored in the MFC and the flow set point $Q_{sp}$ is received from a host controller.

9. The MFC of claim 8, wherein the MFC is programmable to change the pulse-on period $\Delta t$ from the stored default value.

10. The MFC of claim 1, wherein the controller is configured to close the control valve based on a computation of the mass of fluid delivered and/or the duration of the pulse-on period $\Delta t$ during the pulse of fluid.

11. A method of delivering a pulse of fluid, the method comprising:
    receiving a flow set point $Q_{SP}$;
    calculating a mole set point $n_{sp}$ from the flow set point $Q_{sp}$ and a pulse-on period $\Delta t$;
    controlling flow of fluid into a flow channel with a control valve;
    measuring flow rate in the flow channel with a flow sensor; and
    responding to an external input to control flow of fluid through the control valve to initiate a pulse of fluid from the flow channel to control a mass of fluid delivered during the pulse of fluid, the pulse of fluid being terminated in response to the calculated mole set point $n_{sp}$.

12. The method of claim 11, wherein controlling the flow of fluid through the control valve is based on feedback from the flow sensor during the pulse of fluid.

13. The method of claim 11, wherein responding to the external input includes sensing a pressure signal.

14. The method of claim 13, wherein the pressure signal is received via a tap into a pneumatic line, pressure in the pneumatic line opening and closing a shutoff valve.

15. The method of claim 14, further comprising controlling opening and closing of the shutoff valve.

16. The method of claim 13, further comprising converting a rising edge of the pressure signal into a trigger signal for starting pulse gas delivery.

17. The method of claim 11, wherein the mole set point $n_{sp}$ is a targeted amount of the mass of fluid to be delivered during the pulse of fluid.

18. The method of claim 11, wherein the pulse-on period $\Delta t$ is a default value stored in a mass flow controller (MFC) and the flow set point $Q_{sp}$ is received from a host controller.

19. The method of claim 18, further comprising changing the pulse-on period $\Delta t$ from the stored default value.

20. The method of claim 11, further comprising closing the control valve based on a computation of the mass of fluid delivered and/or the duration of the pulse-on period $\Delta t$ during the pulse of fluid.

* * * * *